United States Patent
Ha

(10) Patent No.: US 10,885,997 B2
(45) Date of Patent: Jan. 5, 2021

(54) ONE TIME PROGRAMMABLE MEMORY CELL (OTP) INCLUDING MAIN OTP CELL TRANSISTOR, REDUNDANT OTP TRANSISTOR, AND ACCESS TRANSISTOR

(71) Applicant: Samsung Electronics Co., Ltd., Suwon-si (KR)

(72) Inventor: Min Yeol Ha, Hwasung-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/515,287

(22) Filed: Jul. 18, 2019

(65) Prior Publication Data

US 2020/0219575 A1  Jul. 9, 2020

(30) Foreign Application Priority Data

Jan. 4, 2019 (KR) .................. 10-2019-0001009

(51) Int. Cl.
*G11C 17/16* (2006.01)
*G11C 17/18* (2006.01)
*G11C 29/00* (2006.01)

(52) U.S. Cl.
CPC .............. *G11C 17/18* (2013.01); *G11C 17/16* (2013.01); *G11C 29/70* (2013.01); *G11C 29/785* (2013.01)

(58) Field of Classification Search
CPC ......... G11C 17/16; G11C 17/18; H01L 28/40; H01L 29/4975; H01L 23/528
See application file for complete search history.

(56) References Cited

U.S. PATENT DOCUMENTS

| 6,927,997 | B2 | 8/2005 | Lee et al. | |
|---|---|---|---|---|
| 9,041,089 | B2 | 5/2015 | Chen et al. | |
| 9,263,149 | B2 | 2/2016 | Kim | |
| 9,478,307 | B2 | 10/2016 | Yanagisawa | |
| 9,502,426 | B1* | 11/2016 | Kuo | H01L 27/11206 |
| 9,852,805 | B2* | 12/2017 | Luan | G11C 17/16 |
| 9,899,100 | B2 | 2/2018 | Jeong et al. | |
| 9,922,721 | B2 | 3/2018 | Song | |
| 10,090,059 | B2 | 10/2018 | Kim et al. | |
| 2005/0007855 | A1* | 1/2005 | Lee | G11C 17/16 365/225.7 |
| 2012/0212992 | A1* | 8/2012 | Kanematsu | G11C 17/16 365/103 |
| 2013/0077376 | A1* | 3/2013 | Kim | G11C 17/16 365/104 |
| 2014/0140141 | A1* | 5/2014 | Grant | G11C 29/50012 365/185.25 |
| 2015/0103579 | A1* | 4/2015 | Yanagisawa | G11C 17/18 365/96 |

(Continued)

*Primary Examiner* — Mushfique Siddique
(74) *Attorney, Agent, or Firm* — Harness, Dickey & Pierce, P.L.C.

(57) ABSTRACT

A one-time programmable (OTP) memory cell, and an OTP memory and a memory system including the same may be provided. The OTP memory cell includes a main OTP cell transistor, a redundant OTP cell transistor, and an access transistor that are connected in series between a first node in a floating state and a second node. The OTP memory cell is configured to apply a program voltage to gates of the main OTP cell transistor and the redundant OTP cell transistor, and a program access voltage lower than the program voltage to a gate of the access transistor, during a program operation.

20 Claims, 9 Drawing Sheets

(56) References Cited

U.S. PATENT DOCUMENTS

2016/0093398 A1\* 3/2016 Choi .................... G11C 17/165
　　　　　　　　　　　　　　　　　　　　365/100
2017/0040067 A1\* 2/2017 Byun ................... G11C 29/027
2017/0372790 A1　12/2017 Jeong et al.
2018/0358369 A1\* 12/2018 Lee ........................ G11C 17/16

\* cited by examiner

ONE TIME PROGRAMMABLE MEMORY CELL (OTP) INCLUDING MAIN OTP CELL TRANSISTOR, REDUNDANT OTP TRANSISTOR, AND ACCESS TRANSISTOR

CROSS-REFERENCE TO RELATED APPLICATION

This application claims priority under 35 U.S.C. § 119 to from Korean Patent Application No. 10-2019-0001009, filed on Jan. 4, 2019, in the Korean Intellectual Property Office (KIPO), the disclosure of which is incorporated herein by reference in its entirety.

BACKGROUND

1. Field

Example embodiments relate to one-time programmable (OTP) memory cells, OTP memories and memory systems having the same, and/or a method of operating the same.

2. Description of Related Art

A one-time programmable (OTP) memory may be embodied as an independent device or be included in another device (e.g., a semiconductor memory device or a system device (system-on-chip (SOC)). The OTP memory may be used to provide repair information for control of usage of redundant cells to replace defective cells of a semiconductor memory device, used to enable or disable a part of the semiconductor memory device or a system device, or used to trim capacitance values or resistance values of circuits.

SUMMARY

Some example embodiments of the inventive concepts are directed to providing one-time programmable (OTP) memory cells having a reduced area, OTP memories and memory systems including the same, and/or methods of operating the same.

Aspects of example embodiments of the inventive concepts are not limited thereto, and other aspects not mentioned herein will be clearly understood by those of ordinary skill in the art from the following description.

According to an example embodiment of the inventive concepts, a one-time programmable (OTP) memory cell may include a main OTP cell transistor, a redundant OTP cell transistor, and an access transistor connected in series between a first node and a second node, the first node being in a floating state. The OTP memory cell may be configured to apply a program voltage to a first gate of the main OTP cell transistor and a second gate of the redundant OTP cell transistor and a program access voltage to a third gate of the access transistor, during a program operation, the program access voltage being lower than the program voltage.

According to an example embodiment of the inventive concepts, a one-time programmable (OTP) memory may include an OTP memory cell array including a plurality of OTP memory cells that are connected between a plurality of first row lines, a plurality of second row lines, a plurality of selection lines, and a plurality of bit lines, a row decoder configured to decode a row address to generate a plurality of word line selection signals, and a row driver configured to drive the plurality of first row lines, the plurality of second row lines, and the plurality of selection lines in response to the plurality of word line selection signals. Each of the OTP memory cells may include a main OTP cell transistor, a redundant OTP cell transistor, and an access transistor that are connected in series between a node in a floating state and a corresponding bit line from among the plurality of bit lines, the main OTP cell transistor comprises a first gate connected to a corresponding first row line from among the plurality of first row lines, the redundant OTP cell transistor comprises a second gate connected to a corresponding second row line from among the plurality of second row lines, and the access transistor comprises a third gate connected to a corresponding selection line from among the plurality of selection lines. The row driver may be configured to select a first row line, a second row line, and a selection line from among the plurality of first row lines, the plurality of second row lines, and the plurality of selection lines, respectively, in response to the plurality of word line selection signals, and apply a program voltage to the selected first row line and the selected second row line and a program access voltage to the selected selection line in a program operation, the program access voltage being lower than the program voltage.

According to an example embodiment of the inventive concepts, a memory system may include a controller configured to transmit a program command or a read command, an address signal, and input data, and receive output data, and a one-time programmable (OTP) memory configured to receive one of the program command or the read command, the address signal, and the input data, and transmit the output data. The OTP memory may include an OTP memory cell array including a plurality of OTP memory cells that are connected between a plurality of first row lines, a plurality of second row lines, a plurality of selection lines, and a plurality of bit lines, a row decoder configured to decode a row address included in the address signal to generate a plurality of word line selection signals, and a row driver configured to drive the plurality of first row lines, the plurality of second row lines, and the plurality of selection lines in response to a plurality of word line selection signals. Each of the OTP memory cells may include a main OTP cell transistor, a redundant OTP cell transistor, and an access transistor that are connected in series between a node in a floating state and a corresponding bit line from among the plurality of bit lines, the main OTP cell transistor comprises a first gate connected to a corresponding first row line from among the plurality of first row lines, the redundant OTP cell transistor comprises a second gate connected to a corresponding second row line from among the plurality of second row lines, and the access transistor comprises a third gate connected to a corresponding selection line from among the plurality of selection lines. In a program operation, the row driver is configured to select a first row line, a second row line, and a selection line from among the plurality of first row lines, the plurality of second row lines, and the plurality of selection lines, respectively, in response to the plurality of word line selection signals, and apply a program voltage to the selected first row line and the selected second row line, and a program access voltage to the selected selection line in response to the program command, the program access voltage being lower than the program voltage.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate some general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by the example embodiments disclosed herein. For example, relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Hereinafter, one-time programmable (OTP) memory cells, OTP memories and memory systems including the same, and/or methods of operating the same according to some example embodiments of the inventive concepts will be described with reference to the accompanying drawings.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure.

Figure 1:
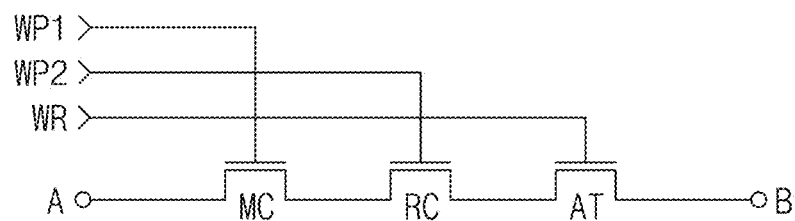
FIG. 1 is a diagram illustrating a structure of an OTP memory cell 1 according to an example embodiment.

FIG. 1 is a diagram illustrating a structure of an OTP memory cell 1 according to an example embodiment. The OTP memory cell 1 may include a main OTP cell transistor MC, a redundant OTP cell transistor RC, and an access transistor AT that are connected in series between a first node A and a second node B. Each of the main OTP cell transistor MC and the redundant OTP cell transistor RC may be an anti-fuse, and may be an N type metal oxide semiconductor field effect transistor (MOSFET). The access transistor AT may be an N type MOSFET. A thickness of a gate oxide of each of the main OTP cell transistor MC and the redundant OTP cell transistor RC may be less than that of a gate oxide of the access transistor AT.

Referring to FIG. 1, a first row signal WP1 may be applied to a gate of the main OTP cell transistor MC, a second row signal WP2 may be applied to a gate of the redundant OTP cell transistor RC, and a word line selection signal WR may be applied to a gate of the access transistor AT. The first node A may be in a floating state, and the second node B may be connected to a bit line.

Figure 2A:
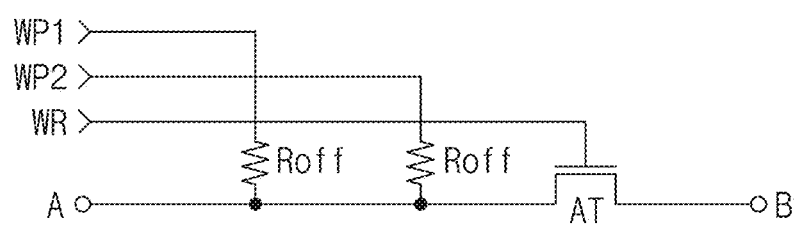
FIG. 2A illustrates a modeling configuration of a non-programmed OTP memory cell according to an example embodiment.
Figure 2B:
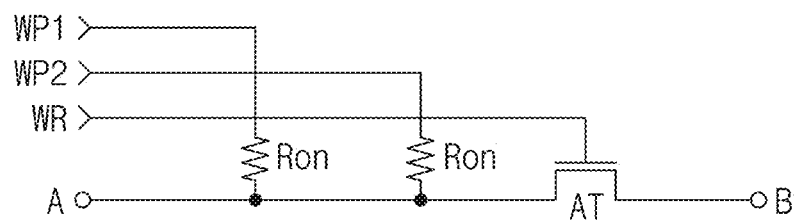
FIG. 2B illustrates a modeling configuration of a programmed OTP memory cell according to an example embodiment.

FIG. 2A illustrates a modeling configuration of a non-programmed OTP memory cell according to an example embodiment. FIG. 2B illustrates a modeling configuration of a programmed OTP memory cell according to an example embodiment.

Referring to FIG. 2A, each of non-programmed main OTP cell transistor MC and non-programmed redundant OTP cell transistor RC may be equivalent to an off resistor Roff. The off resistor Roff may be a resistor when each of the non-programmed main OTP cell transistor MC and the non-programmed redundant OTP cell transistor RC is in an open state, and may have a relatively high resistance value. That is, the non-programmed OTP memory cell may have a configuration in which the off resistors Roff are connected in parallel.

Each of the non-programmed main OTP cell transistor MC and the non-programmed redundant OTP cell transistor RC may have non-programmed data (e.g., "0").

Referring to FIG. 2B, during a program operation, a program voltage (e.g., a high voltage (HV) of about 5 V or more) may be applied as a first row signal WP1 and a second row signal WP2, a program access voltage (VDDIO, e.g., about 3 V), which is lower than the program voltage, may be applied as a word line selection signal WR, a node A may be in a floating state F, and a program allowance voltage (VSS, e.g., about 0 V), which is lower than the program access voltage, may be applied to a node B. In this case, an access transistor AT may be turned on, and a voltage difference between a gate and a drain of each of the main OTP cell transistor MC and the redundant OTP cell transistor RC may be relatively large. Thus, a gate oxide of each of the main OTP cell transistor MC and the redundant OTP cell transistor RC may break down, and each of the main OTP cell transistor MC and the redundant OTP cell transistor RC may be equivalent to an on resistor Ron. The on resistor Ron is a resistor when the main OTP cell transistor MC and the redundant OTP cell transistor RC break down and may have a relatively low resistance value. The on resistor Ron may be much lower than the off resistor Roff. That is, the programmed OTP memory cell may have a configuration in which the on resistors Ron are connected in parallel.

As described above, each of the programmed main OTP cell transistor MC and the programmed redundant OTP cell transistor RC may have programmed data (e.g., "1") by performing a program operation thereon once.

Referring to FIGS. 2A and 2B, a read operation of an OTP memory cell will be described below.

In the read operation, a read voltage RV (e.g., about 2 V), which may be lower than the high voltage HV and the program access voltage VDDIO and higher than the program allowance voltage VSS may be applied as the first row signal WP1 and the second row signal WP2, a read access voltage VDD (e.g., about 1.5V), which may be lower than the read voltage RV and higher than the program allowance voltage VSS, may be applied as the word line selection signal WR, the node A may be in the floating state F, and a read allowance voltage VSS (e.g., 0V), which is the same as the program allowance voltage VSS, may be applied to the node B. In this case, the access transistor AT may be turned on, and thus an off current Icell_off (which may be substantially zero) may flow to the node B via the off resistors Roff which are connected in parallel, as illustrated in FIG. 2A and on current Icell_on1 may flow to the node B via the on resistors Ron which are connected in parallel, as illustrated in FIG. 2B. Although not specifically shown, on current Icell_on2 which is smaller than Icell_on1 may flow to the node B via one of the on resistors Ron even when the on resistor Ron and the off resistor Roff are connected in parallel since one of the main OTP cell transistor MC and the redundant OTP transistor RC is not programmed (or is defective). The off current Icell_off may be much less than the on current Icell_on1 and Icell_on2. Icell_on1 and Icell_on2 may be collectively referred to as Icell_on. Although not shown, the off current Icell_off may be sensed and amplified to output the non-programmed data (e.g., "0"), and the on current Icell_on may be sensed and amplified to output the programmed data (e.g., "1").

The main OTP cell transistor MC and the redundant OTP cell transistor RC may be simultaneously programmed by performing the program operation described above with reference to FIGS. 2A and 2B once.

As an example, the program operation may be divided into a first program operation and a second program operation to be sequentially performed.

Figure 3A:
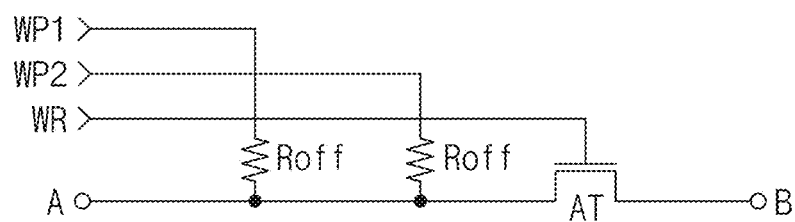
FIG. 3A illustrates a modeling configuration of a non-programmed OTP memory cell according to an example embodiment.
Figure 3B:
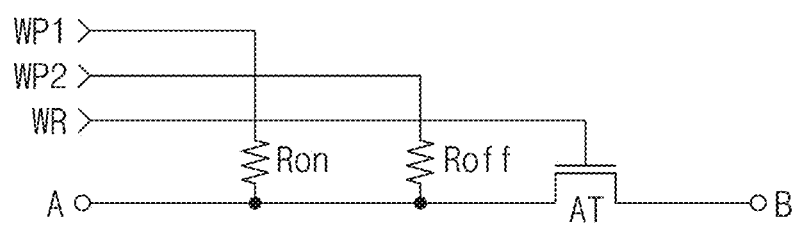
FIG. 3B illustrates a modeling configuration of an OTP memory cell having a programmed main OTP cell according to an example embodiment.
Figure 3C:
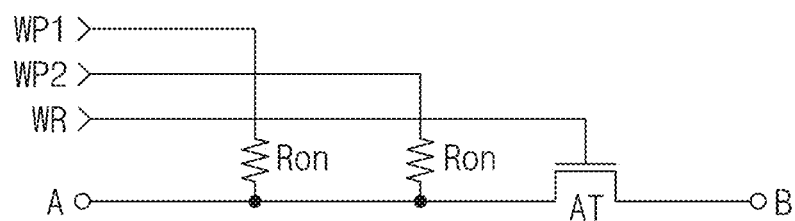
FIG. 3C illustrates a modeling configuration of an OTP memory cell having a programmed redundant OTP cell according to an example embodiment.

FIG. 3A illustrates a modeling configuration of a non-programmed OTP memory cell according to an example embodiment. FIG. 3B illustrates a modeling configuration of an OTP memory cell having a programmed main OTP cell according to an example embodiment. FIG. 3C illustrates a modeling configuration of an OTP memory cell having a programmed redundant OTP cell according to an example embodiment.

The non-programmed OTP memory cell of FIG. 3A may have the same configuration as that of FIG. 2A.

Referring to FIG. 3B, during a first program operation (e.g., a main OTP cell program operation), a program voltage HV may be applied as a first row signal WP1, a program access voltage VDDIO may be applied as a second row signal WP2 and a word line selection signal WR, a node A may be in the floating state F, and a program allowance voltage VSS may be applied to a node B. In this case, an access transistor AT may be turned on and a voltage difference between a gate and a drain of the main OTP cell transistor MC may be relatively large. Thus, a gate oxide of the main OTP cell transistor MC may break down, the main OTP cell transistor MC may become an on resistor Ron, and the redundant OTP cell transistor RC may become an off resistor Roff.

Referring to FIG. 3C, after the first program operation is performed, during a second program operation (e.g., a redundant OTP cell program operation), the program voltage HV may be applied as the second row signal WP2, the program access voltage VDDIO may be applied as the word line selection signal WR, the first row signal WP1 and the node A may be in the floating state F, and the program allowance voltage VSS may be applied to the node B. In this case, the access transistor AT may be turned on and the voltage difference between the gate and the drain of the redundant OTP cell transistor RC may be relatively large. Accordingly, a gate oxide of the redundant OTP cell transistor RC may break down and the redundant OTP cell transistor RC may become an on resistor Ron.

As described above, each of the main OTP cell transistor MC and the redundant OTP cell transistor RC may be programmed to have programmed data (e.g., "1") by sequentially performing the first program operation and the second program operation (e.g., by performing the program operation twice).

A read operation of the non-programmed OTP memory cell illustrated in FIG. 3A and a read operation of the programmed OTP memory cell illustrated in FIG. 3C will be easily understood by referring to the read operation described above with reference to FIGS. 2A and 2B.

In an OTP memory cell according to the above-described example embodiment, a main OTP cell transistor MC and a redundant OTP cell transistor RC are not separated from each other but are connected in series, and thus an access transistor may not be desired to be provided for each of the main OTP cell transistor MC and the redundant OTP cell transistor RC. Accordingly, the OTP memory cell may have a relatively simple structure and be relatively easily controlled.

Figure 4:
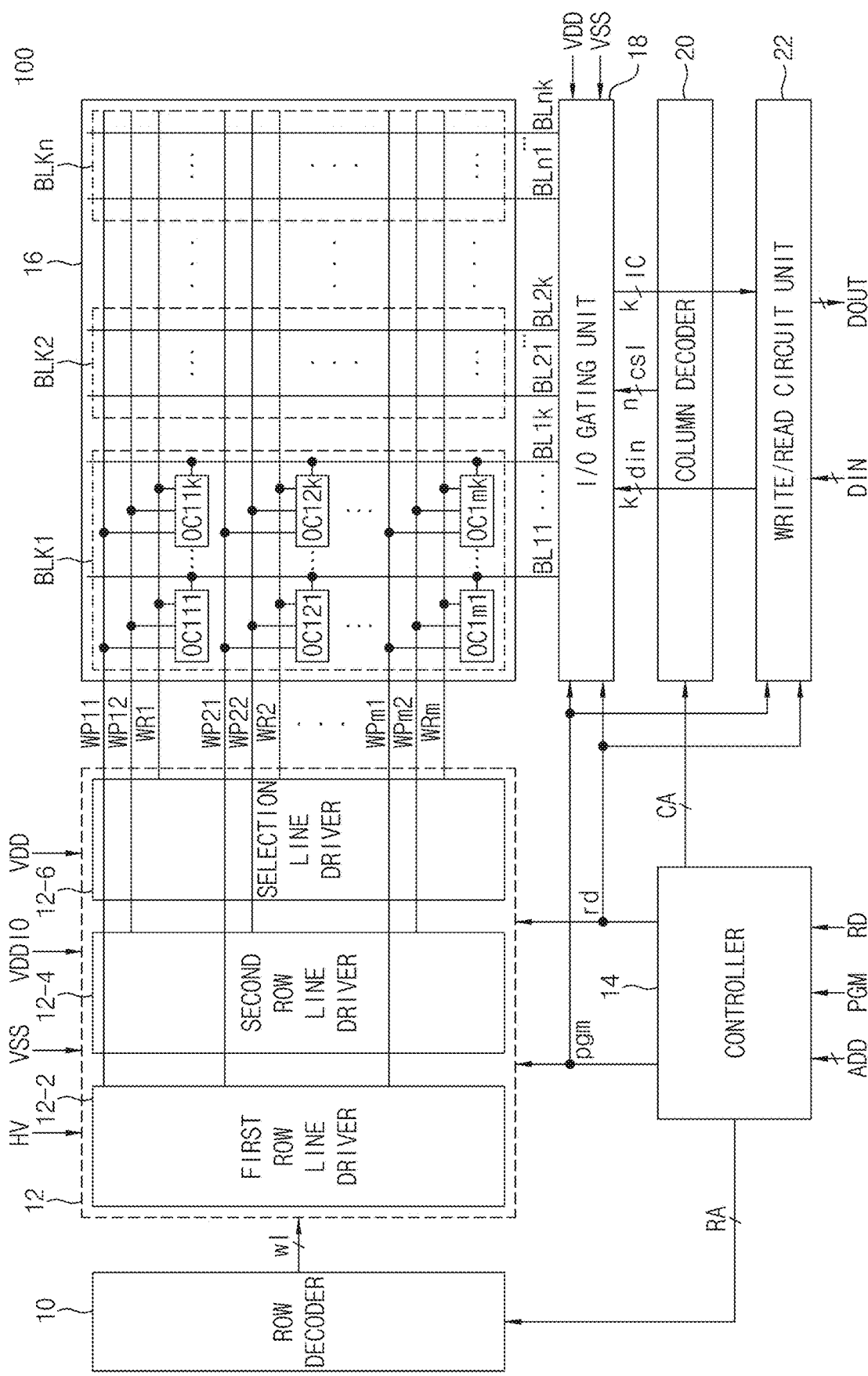
FIG. 4 is a block diagram illustrating a structure of an OTP memory 100 according to an example embodiment.

FIG. 4 is a block diagram illustrating a structure of an OTP memory 100 according to an example embodiment. The OTP memory 100 may include a row decoder (alternatively, row decoder circuitry) 10, a row line driver (alternatively, row line driver circuitry) 12, a controller 14, an OTP memory cell array 16, an input/output (I/O) gating circuit (or circuitry) 18, a column decoder 20, and a write/read circuit (or circuitry) 22. The row line driver 12 may include a first row line driver (alternatively, first row line driver circuitry) 12-2, a second row line driver (alternatively, second row line driver circuitry)12-4, and a selection line driver (alternatively, selection line driver circuitry)12-6.

Functions of the blocks illustrated in FIG. 4 will be described below.

The row decoder 10 may generate m word line selection signals w1 by decoding a row address RA.

The first row line driver 12-2 may drive first row lines WP11 to WPm1 in response to either a program command signal pgm or a read command signal rd and word line selection signals w1. The first row line driver 12-2 may apply a program voltage HV to at least one first row line selected in response to the program command signal pgm and the word line selection signals w1, and apply a non-access program voltage (e.g., VDD) lower than the program access voltage VDDIO to the non-selected first row lines. The first row line driver 12-2 may apply a read voltage RV to at least one first row line selected in response to the read command signal rd and word line selection signals w1, and apply a non-access read voltage (e.g., VSS) to the non-selected first row lines.

The second row line driver 12-4 may drive second row lines WP12 to WPm2 in response to either the program command signal pgm or the read command signal rd and the word line selection signals w1. The second row line driver 12-4 may apply the program voltage HV to at least one second row line selected in response to the program command signal pgm and word line selection signals w1, and apply a program non-access voltage (e.g., VDD) to the non-selected second row lines. The second row line driver 12-4 may apply the read voltage RV to at least one second row line selected in response to the read command signal rd and the word line selection signals w1, and apply a read non-access voltage (e.g., VSS) lower than the read voltage RV to the non-selected second row lines.

The selection line driver 12-6 may drive selection lines WR1 to WRm1 in response to either the program command signal pgm or the read command signal rd and the word line selection signals w1. The selection line driver 12-6 may apply the program access voltage VDDIO to at least one selection line selected in response to the program command signal pgm and the word line selection signal w1, and apply the program non-access voltage (e.g., VSS) to the non-selected selection lines. The selection line driver 12-6 may apply a read access voltage VDD to at least one selection line selected in response to the read command signal rd and the word line selection signals w1, and apply the read non-access voltage (e.g., VSS) to the non-selected selection lines.

The controller 14 may receive an address signal ADD from the outside and generate a row address RA and a column address CA. Furthermore, the controller 14 may receive a program command PGM and a read command RD from the outside and generate the program command signal pgm and the read command signal rd.

The OTP memory cell array 16 may include n OTP memory blocks BLK1 to BLKn. Each of the n OTP memory blocks BLK1 to BLKn may include OTP memory cells OC111 to OC1*mk*, OC211 to OC2*mk* (not shown), . . . , and OC*n*11 to OC*nmk* (not shown) connected between m first row lines WP11 to WPm1, m second row lines WP12 to WPm2 and m selection lines WR1 to WRm, and k bit lines BL11 to BL1*k*, BL21 to BL2*k*, . . . , or BL*n*1 to BL*nk*. Each of the OTP memory cells may have the same structure and perform the same operations as described above with reference to FIGS. 1 to 3.

The I/O gating circuit 18 may apply a program allowance voltage to k bit lines selected by n column selection signals cs1 in response to the program command signal pgm and k-bit input data din based on the k-bit input data din, or may apply a program prohibition voltage to the non-selected bit lines. The I/O gating circuit 18 may transmit k currents IC output via the k bit lines selected by the column selection signals cs1 in response to the read command signal rd. In this case, a read allowance voltage may be applied to the selected k-bit lines. For example, each of the program allowance voltage and the read allowance voltage may be VSS, and the program prohibition voltage may be VDDIO.

The column decoder 20 may generate the n column selection signals cs1 by decoding the column address CA. In an example embodiment, the k bit lines BL11 to BL1*k*, BL21 to BL2*k*, . . . , or BL*n*1 to BL*nk* of each of the n memory blocks BLK1 to BLKn may be selected by the n column selection signals cs1.

The write/read circuit 22 may receive the k-bit input data DIN applied from the outside and output the k-bit input data DIN to the I/O gating circuit 18 in response to the program command signal pgm, receive the k currents IC output from the I/O gating circuit 18, amplify the k currents IC, and output the k-bit output data DOUT to the outside in response to the read command signal rd.

Figure 5:
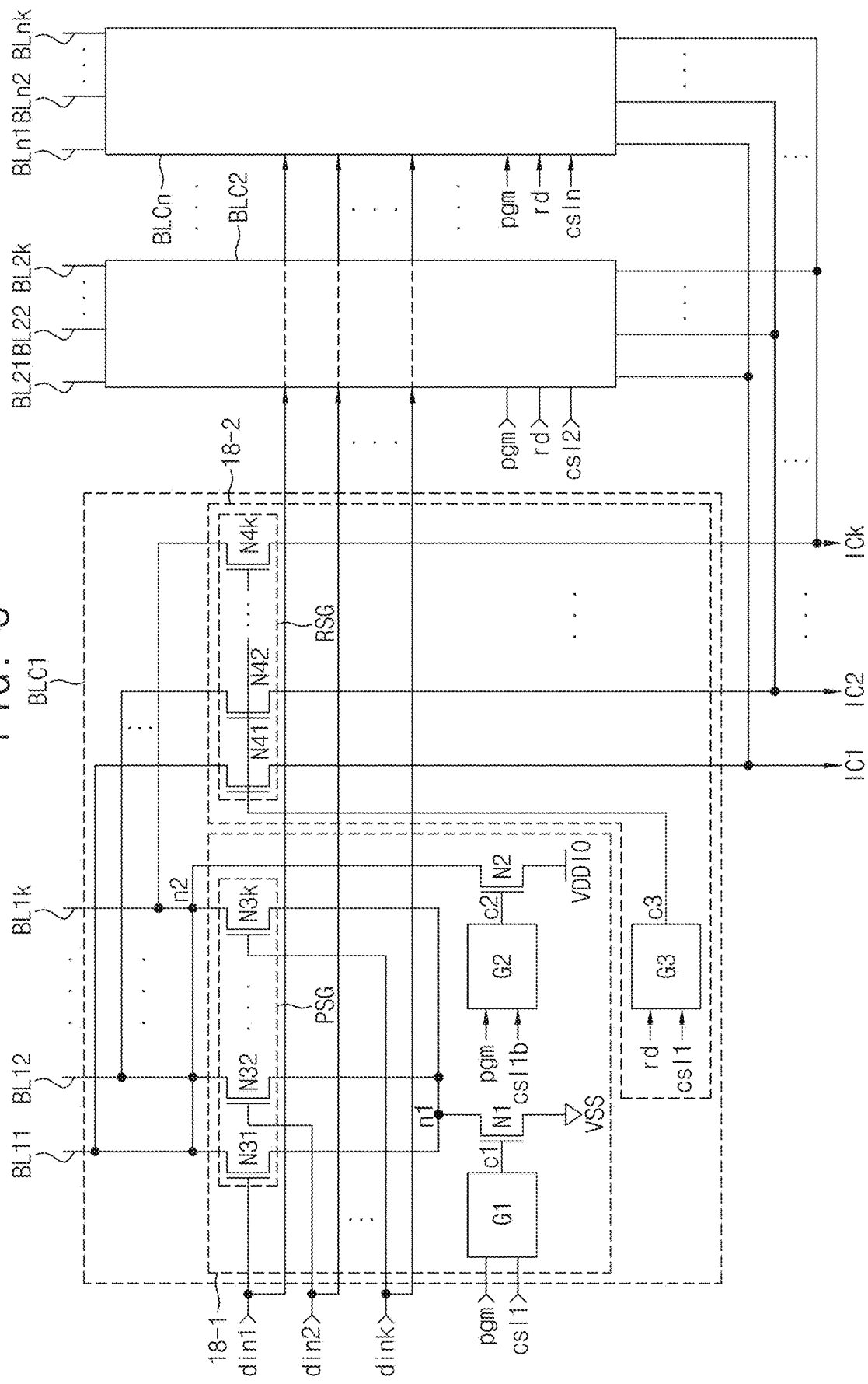
FIG. 5 is a diagram illustrating a structure of an I/O gating unit of an OTP memory according to an example embodiment.

FIG. 5 is a diagram illustrating a structure of an I/O gating circuit of an OTP memory according to an example embodiment. The I/O gating circuit 18 may include n I/O gating circuits BLC1 to BLCn.

Referring to FIG. 5, each of the n I/O gating circuits BLC1 to BLCn may include a program gating circuit 18-1 and a read gating circuit 18-2. The program gating circuit 18-1 may include a program gate PSG, a first logic gate G1, a second logic gate G2, and first and second NMOS transistors N1 and N2. The read gating circuit 18-2 may include a read gate RSG and a third logic gate G3. The program gate PSG may include k third NMOS transistors N31 to N3*k*. The read gate RSG may include k fourth NMOS transistors N41 to N4*k*.

Functions of the components illustrated in FIG. 5 will be described below.

The first logic gate G1 may generate a first control signal c1 by combining, e.g., performing an AND operation on, a program command signal pgm and a corresponding column selection signal cs11, cs12, . . . , or cs1*n*.

The first NMOS transistor N1 may be turned on, and transmit a program allowance voltage VSS to a first node n1 in response to the first control signal c1.

The second logic gate G2 may generate a second control signal c2 by combining the program command signal pgm and a corresponding inverted column selection signal cs11*b*, cs12*b*, . . . , or cs1*nb*. The corresponding inverted column selection signal cs11*b*, cs12*b*, . . . , or cs1*nb* may be a signal obtained by inverting a corresponding column selection signal cs11, cs12, . . . , or cs1*n*.

The second NMOS transistor N2 may be turned on, and transmit a program prohibition voltage VDDIO to the corresponding k bit lines BL11 to BL1*k*, BL21 to BL2*k*, . . . , or BL*n*1 to BL*nk* in response to the second control signal c2.

Each of the k third NMOS transistors N31 to N3*k* may be connected between each of corresponding k bit lines BL11 to BL1*k*, BL21 to BL2*k*, or BL*n*1 to BL*nk* and the first node n1 and may be turned on in response to corresponding bit input data among k-bit input data din1 to dink. When the k third NMOS transistors N31 to N3*k* are turned on, the program allowance voltage VSS may be transmitted to the corresponding k bit lines BL11 to BL1*k*, BL21 to BL2*k*, . . . , or BL*n*1 to BL*nk*.

During a program operation, the program gating circuit 18-1 of one of the n I/O gating circuits BLC1 to BLCn may transmit or may not transmit the program allowance voltage VSS via the k third transistors N31 to N3*k* in response to the k-bit input data din1 to dink and the first control signal c1. When the program allowance voltage VSS is transmitted, the program operation may be performed on a corresponding OTP memory cell. In contrast, when the program allowance voltage VSS is not transmitted, the program operation may not be performed on the corresponding OTP memory cell. When the program operation is performed on another OTP memory block, the program gating circuit 18-1 of each of the (n−1) bit line control circuits corresponding to OTP memory blocks on which the program operation is not performed may apply a program prohibition voltage VDDIO to the corresponding k bit lines BL11 to BL1k, BL21 to BL2k, . . . , or BLn1 to BLnk in response to the second control signal c2.

The third logic gate G3 may generate a third control signal c3 by combining (e.g., by performing the AND operation on) a read command signal rd and a corresponding column selection signal cs11, cs12, . . . , or cs1n.

The k fourth NMOS transistors N41 to N4k may be turned on, and transmit k currents IC1 to ICk flowing through the corresponding k bit lines BL11 to BL1k, BL21 to BL2k, . . . , or BLn1 to BLnk, respectively, in response to the third control signal c3.

During a read operation, the read gating circuit 18-2 of each of the n I/O gating circuits BLC1 to BLCn may transmit the k currents IC1 to ICk flowing through the corresponding k bit lines BL11 to BL1k, BL21 to BL2k, . . . , or BLn1 to BLnk in response to the third control signal c3.

Although not shown, during the read operation, a read allowance voltage (e.g., VSS) may be applied to the corresponding k bit lines BL11 to BL1k, BL21 to BL2k, . . . , or BLn1 to BLnk. During the read operation, the read gating circuit 18-2 of one of the n I/O gating circuits BLC1 to BLCn may generate the k currents IC1 to ICk flowing through the k fourth NMOS transistors N41 to N4k, respectively. A sense amplifier (not shown) of the write/read circuit 22 may generate k-bit output data DOUT by sensing and amplifying the k currents IC1 to ICk.

Figure 6:
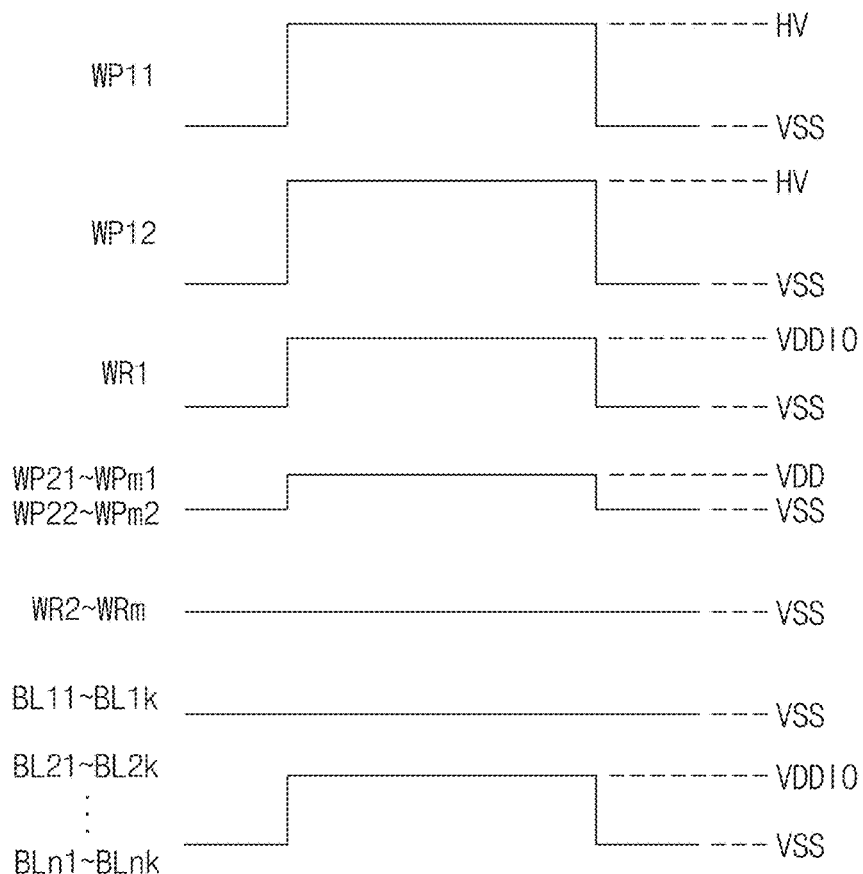
FIG. 6 is an operation-timing diagram illustrating a program operation of an OTP memory according to an example embodiment.

FIG. 6 is an operation-timing diagram illustrating a program operation of an OTP memory according to an example embodiment.

The program operation of the OTP memory will be described with reference to FIGS. 4 to 6 below.

The first row line driver 12-2 may apply a program voltage HV to a first row line WP11 and a program non-access voltage VDD to the non-selected first row lines WP21 to WPm1. The second row line driver 12-4 may apply the program voltage HV to a second row line WP12 and a program non-access voltage VDD to the non-selected second row lines WP22 to WPm2. The selection line driver 12-6 may apply a program access voltage VDDIO to a selection line WR1 and a program non-access voltage VSS to the non-selected selection lines WR2 to WRm. In this case, OTP memory cells OC111, . . . , OC11k, . . . of the OTP memory cell array 16 that are connected to the first row line WP11, the second row line WP12, and the selection line WR1 may be selected.

The first logic gate G1 of the I/O gating circuit BLC1 may generate the first control signal c1, which is at a logic "high" level in response to the program command signal pgm, and the column selection signal cs11. The first NMOS transistor N1 of the I/O gating circuit BLC1 may be turned on, and transmit the program allowance voltage VSS to the first node N1. The second logic gates G2 of the I/O gating circuits BLC2 to BLCn may generate a second control signal c2 that is at a logic "high" level. The second NMOS transistors N2 of the I/O gating circuits BLC2 to BLCn may be turned on, and transmit a program prohibition voltage VDDIO to the second nodes n2. Thus, the program allowance voltage VSS may be applied to the selected bit lines BL11 to BL1k, and the program prohibition voltage VDDIO may be applied to the non-selected bit lines BL21 to BL1k, . . . , BLn1 to BLnk.

In this case, when the k-bit input data din1 to dink is "110 . . . 01", three third NMOS transistors N31, N32, and N3k among the third NMOS transistors N31 to N3k may be turned on and thus the OTP memory cells OC111, OC112 (not shown), and OC11k may be programmed and the other OTP memory cells may not be programmed.

Figure 7:
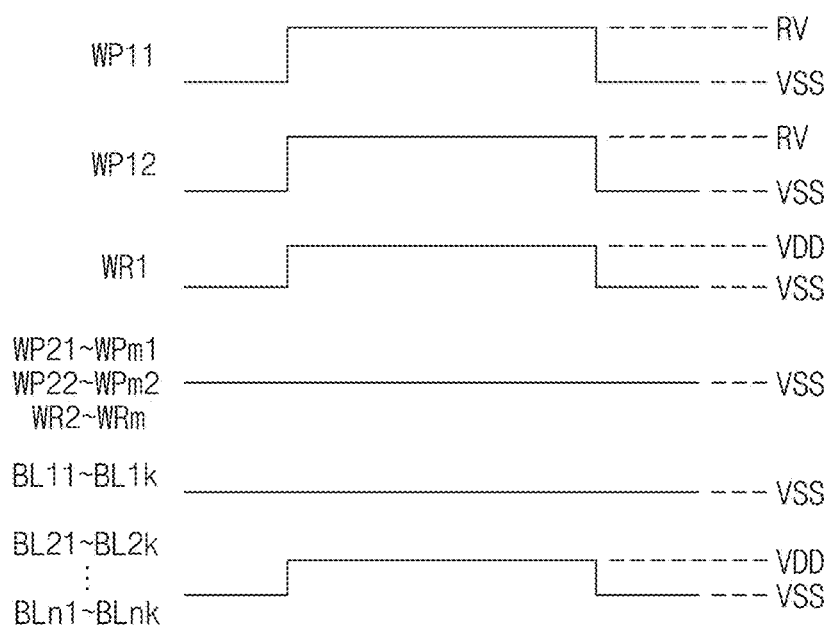
FIG. 7 is an operation-timing diagram illustrating a read operation of an OTP memory according to an example embodiment.

FIG. 7 is an operation-timing diagram illustrating a read operation of an OTP memory according to an example embodiment.

The read operation of the OTP memory will be described with reference to FIGS. 4, 5, and 7 below.

The first row line driver 12-2 may apply a read voltage RV to the first row line WP11 and a read non-access voltage VSS to the non-selected first row lines WP21 to WPm1. The second row line driver 12-4 may apply the read voltage RV to the second row line WP12 and the read non-access voltage VSS to the non-selected second row lines WP22 to WPm2. The selection line driver 12-6 may apply a read access voltage VDD to the selection line WR1 and a read non-access voltage VSS to the non-selected selection lines WR2 to WRm. In this case, the OTP memory cells OC111, . . . , OC11k, . . . of the OTP memory cell array 16 connected to the first row line WP11, the second row line WP12, and the selection line WR1 may be selected.

In the I/O gating circuit BLC1, the fourth NMOS transistors N41 to N4k may be turned on when the third control signal c3 is at a logic "high" level. Thus, the k currents IC1 to ICk may flow through the fourth NMOS transistors N41 to N4k from the selected OTP memory cells OC111, OC112 (not shown), . . . , OC11k via the k bit lines BL11 to BL1k. For example, when k-bit data programmed in the selected OTP memory cells OC111, OC112, . . . , OC11k is "110 . . . 01", three currents IC1, IC2, and ICk flowing through three programmed OTP memory cells OC111, OC112 (not shown), and OC11k among the selected OTP memory cells OC111, OC112 (not shown), . . . , OC11k, respectively, may be higher than those flowing through the remaining non-programmed OTP memory cells. Although not shown, the k-bit output data DOUT may be generated by sensing and amplifying k currents IC1 to ICk by the sense amplifier of the write/read circuit 22.

Figure 8:
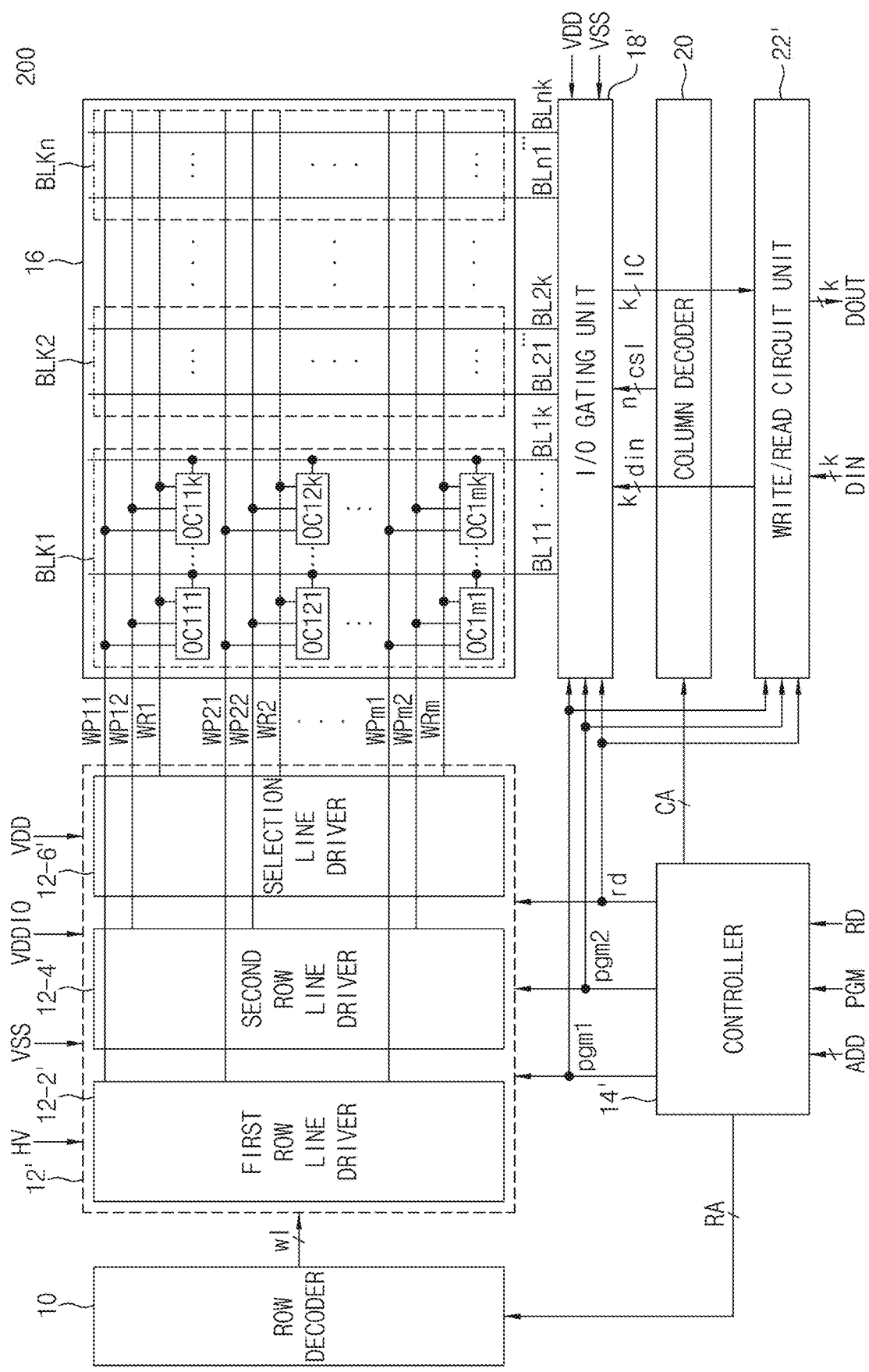
FIG. 8 is a block diagram illustrating a structure of an OTP memory 200 according to an example embodiment.

FIG. 8 is a block diagram illustrating a structure of an OTP memory 200 according to an example embodiment. The row line driver 12, the controller 14, the I/O gating circuit 18, and the write/read circuit 22 of the OTP memory 100 illustrated in FIG. 4 are replaced with a row line driver 12', a controller 14', an I/O gating circuit 18', and a write/read circuit 22' of the OTP memory 200, respectively, in FIG. 8. The row line driver 12' may include a first row line driver 12-2', a second row line driver 12-4', and a selection line driver 12-6'.

Functions of the blocks illustrated in FIG. 8 replacing those of FIG. 4 will be described below.

The first row line driver 12-2' may drive first row lines WP11 to WPm1 in response to a first program command signal pgm1, a second program command signal pgm2, or a read command signal rd, and in response to word line selection signals w1. The first row line driver 12-2' may apply a program voltage HV to at least one first row line selected in response to the first program command signal pgm1 and the word line selection signals w1, make at least one first row line selected in response to the second program command signal pgm2. make the word line selection signals w1 be in the floating state, and apply a program non-access voltage VDD to the non-selected first row lines. The first row line driver 12-2' may apply a read voltage RV to at least one first row line selected in response to the read command signal rd and the word line selection signals w1, and apply a read non-access voltage VSS to the non-selected first row lines.

The second row line driver 12-4' may drive second row lines WP12 to WPm2 in response to the first program command signal pgm1, the second program command signal pgm2, or the read command signal rd and in response to the word line selection signals w1. The second row line driver 12-4' may apply a program access voltage VDDIO to at least one second row line selected in response to the first program command signal pgm1 and the word line selection signals w1, apply the program non-access voltage VDD to the non-selected second row lines, apply the program voltage HV to at least one second row line selected in response to the second program command signal pgm2 and the word line selection signals w1, and apply the program non-access voltage VDD to the non-selected second row lines. The second row line driver 12-4' may apply the read voltage RV to at least one second row line selected in response to the read command signal rd and the word line selection signals w1, and apply the read non-access voltage VSS to the non-selected second row lines.

The selection line driver 12-6' may drive selection lines WR1 to WRm in response to the first program command signal pgm1, the second program command signal pgm2, or the read command signal rd, and in response to the word line selection signals w1. The selection line driver 12-6' may apply the program access voltage VDDIO to at least one selection line selected in response to the first program command signal pgm1 or the second program command signal pgm2 and in response to the word line selection signal w1, and apply the program non-access voltage VSS to the non-selected selection lines. The selection line driver 12-6' may apply the read access voltage VDD to at least one selection line selected in response to the read command signal rd and the word line selection signals w1, and apply the read non-access voltage VSS to the non-selected selection lines.

The controller 14' may receive an address signal ADD from the outside and generate a row address RA and a column address CA. Furthermore, the controller 14' may receive a program command PGM from the outside and sequentially generate the first program command signal pgm1 and the second program command signal pgm2, and may receive a read command RD and generate the read command signal rd. Unlike that illustrated in FIG. 8, the controller 14' may receive a first program command PGM1 and a second program command PGM2 from the outside, and generate the first program command signal pgm1 and the second program command signal pgm2.

The I/O gating circuit 18' may apply a program allowance voltage VSS to k bit lines selected by n column selection signals cs1 on the basis of k-bit input data DIN in response to either the first program command signal pgm1 or the second program command signal pgm2 and the k-bit input data DIN, or may apply a program prohibition voltage VDDIO to the non-selected bit lines. The I/O gating circuit 18' may transmit currents IC flowing through k bit lines selected by the column selection signals cs1 in response to the read command signal rd. In this case, a read allowance voltage may be applied to the selected k bit lines. For example, each of the program allowance voltage and the read allowance voltage may be VSS, and the program prohibition voltage may be VDDIO.

The write/read circuit 22' may receive the k-bit input data DIN applied from the outside in response to the first program command signal pgm1 or the second program command signal pgm2, output the k-bit input data DIN to the I/O gating circuit 18', sense and amplify k currents IC output from the I/O gating circuit 18' in response to the read command signal rd, and output the k-bit output data DOUT to the outside.

Figure 9:
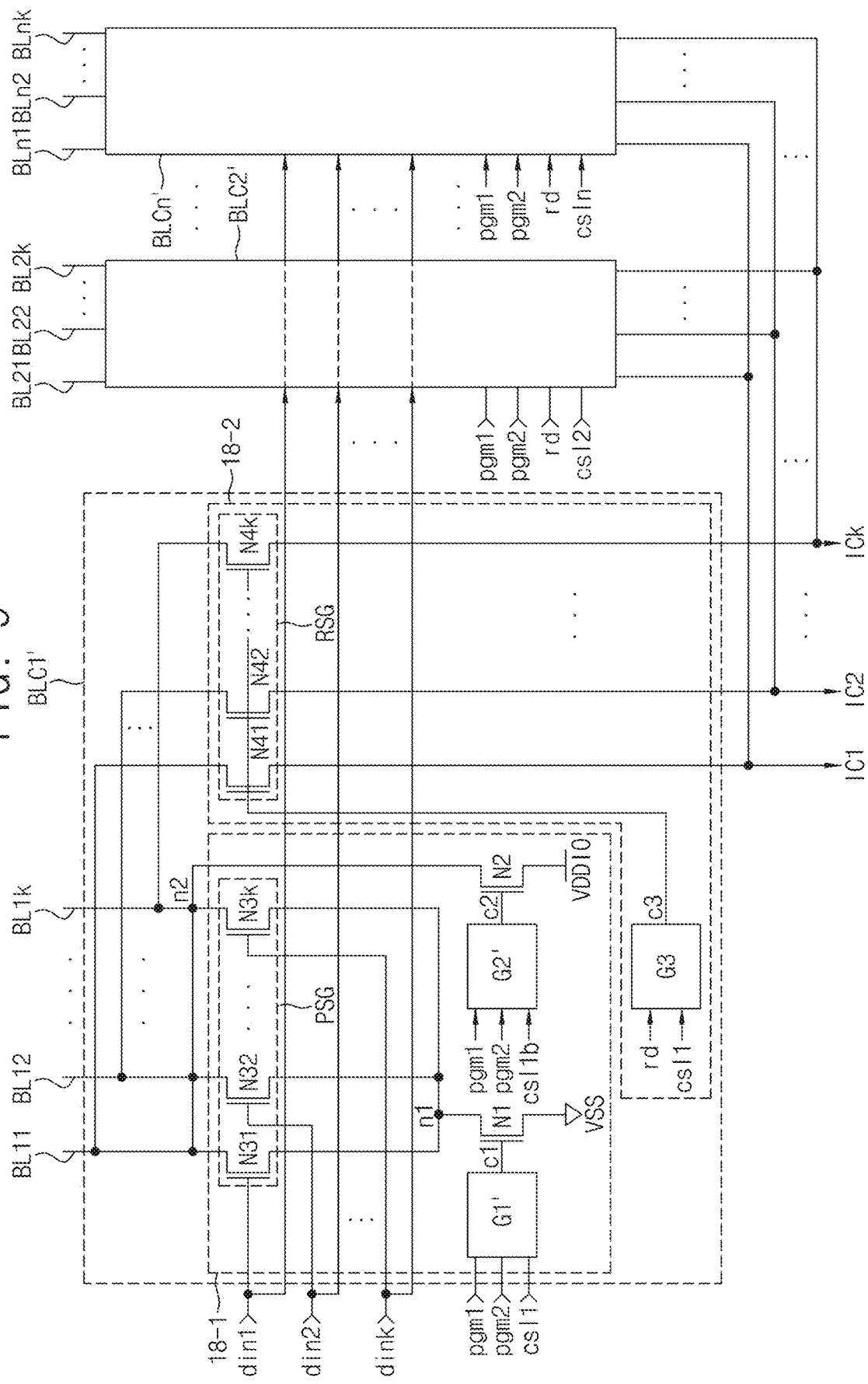
FIG. 9 is a diagram illustrating a structure of an I/O gating circuit 18' of an OTP memory according to an example embodiment.

FIG. 9 is a diagram illustrating a structure of an I/O gating circuit 18' of an OTP memory according to an example embodiment. The I/O gating circuit 18' may include n I/O gating circuits BLC1' to BLCn'. In a program gating circuit 18-1' of each of the n I/O gating circuits BLC1' to BLCn', the first logic gate G1 and the second logic gate G2 included in the n I/O gating circuits BLC1 to BLCn illustrated in FIG. 5 may be replaced with a first logic gate G1' and a second logic gate G2'.

Functions of the blocks illustrated in FIG. 9 replacing those of FIG. 5 will be described below.

The first logic gate G1' may generate a first control signal c1 by combining (e.g., by performing the AND operation on) either a first program command signal pgm1 or a second program command signal pgm2 and a corresponding column selection signal cs11, cs12, . . . , or cs1n.

The second logic gate G2' may generate a second control signal c2 by combining either the first program command signal pgm1 or the second program command signal pgm2 and a corresponding inverted column selection signal cs11b, cs12b, . . . , or cs1nb.

Figure 10:
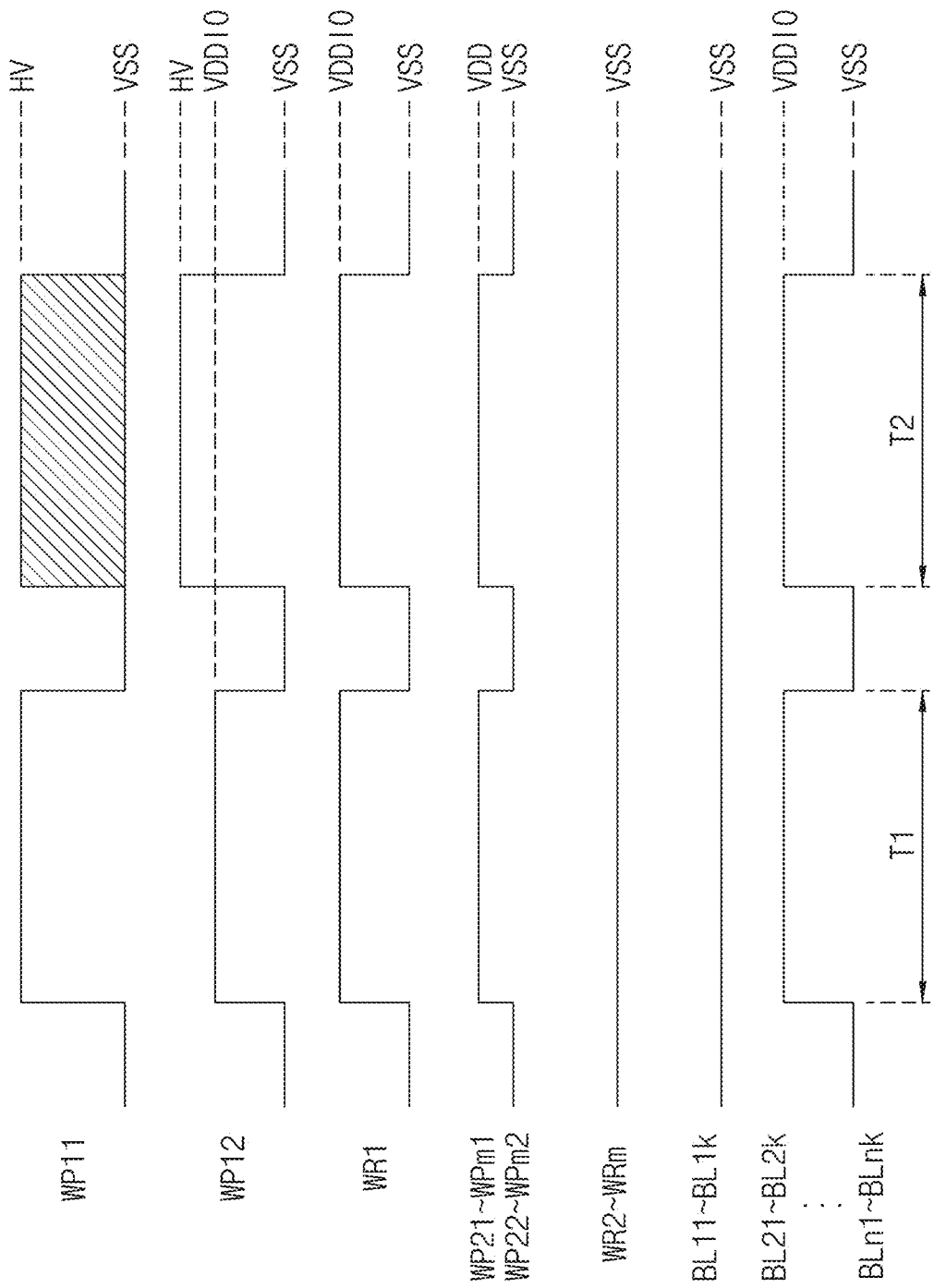
FIG. 10 is an operation-timing diagram illustrating a program operation of an OTP memory according to an example embodiment.

FIG. 10 is an operation-timing diagram illustrating a program operation of an OTP memory according to an example embodiment.

During a first program operation (e.g., during a first period T1), the first row line driver 12-2' may apply the program voltage HV to the first row line WP11 and the program non-access voltage VDD to the non-selected first row lines WP21 to WPm1. The second row line driver 12-4' may apply the program access voltage VDDIO to the second row line WP12 and the program non-access voltage VDD to the non-selected second row lines WP22 to WPm2. The selection line driver 12-6' may apply the program access voltage VDDIO to the selection line WR1 and the program non-access voltage VSS to the non-selected selection lines WR2 to WRm. In this case, the OTP memory cells OC111, . . . , OC11k, . . . of the OTP memory cell array 16 that are connected to the first row line WP11, the second row line WP12, and the selection line WR1 may be selected.

The first logic gate G1' of the I/O gating circuit BLC1' may generate the first control signal c1 that is at a logic "high" level in response to the first program command signal pgm1 and the column selection signal cs11. The first NMOS transistor N1 of the I/O gating circuit BLC1' may be turned on, and transmit the program allowance voltage VSS to the first node n1. The second logic gates G2' of the I/O gating circuits BLC2' to BLCn' may generate the second control signal c2 that is at the logic "high" level. The second NMOS transistors N2 of the I/O gating circuits BLC2' to BLCn' may be turned on, and transmit the program prohibition voltage VDDIO to the second nodes n2. Accordingly, the program allowance voltage VSS may be applied to the selected bit lines BL11 to BL1k, and the program prohibition voltage VDDIO may be applied to the non-selected bit lines BL21 to BL1k, . . . , BLn1 to BLnk.

In this case, when the k-bit input data din1 to dink is "110 . . . 01", the three third NMOS transistors N31, N32, and N3k among the third NMOS transistors N31 to N3k may be turned on, and thus main OTP cell transistors MC of the OTP memory cells OC111, OC112 (not shown), and OC11k may be programmed, and main OTP cell transistors MC of the remaining OTP memory cells may not be programmed. Further, redundant OTP cell transistors RC of the OTP memory cells OC111 to OC11k may not be programmed.

During a second program operation (e.g., during a second period T2), the first row line driver 12-2' may make the first row line WP11 be in the floating state and apply the program non-access voltage VDD to the non-selected first row lines WP21 to WPm1. The second row line driver 12-4' may apply the program voltage HV to the second row line WP12 and the program non-access voltage VDD to the non-selected second row lines WP22 to WPm2. The selection line driver 12-6 may apply the program access voltage VDDIO to the selection line WR1 and the program non-access voltage VSS to the non-selected selection lines WR2 to WRm. In this case, the OTP memory cells OC111, . . . , OC11k, . . . of the OTP memory cell array 16 which are connected to the first row line WP11, the second row line WP12, and the selection line WR1 may be selected.

The first logic gate G1' of the I/O gating circuit BLC1' may generate the first control signal c1 that is at the logic "high" level in response to the second program command signal pgm2 and the column selection signal cs11. The first NMOS transistor N1 of the I/O gating circuit BLC1' may be turned on, and transmit program allowance voltage VSS to the first node n1. The second logic gates G2' of the I/O gating circuits BLC2' to BLCn' may generate the second control signal c2 that is at the logic "high" level. The second NMOS transistors N2 of the I/O gating circuits BLC2' to BLCn' may be turned on, and transmit the program prohibition voltage VDDIO to the second nodes n2. Thus, the program allowance voltage VSS may be applied to the selected bit lines BL11 to BL1k, and the program prohibition voltage VDDIO may be applied to the non-selected bit lines BL21 to BL1k, . . . , BLn1 to BLnk.

In this case, when the k-bit input data din1 to dink is "110 . . . 01", the three third NMOS transistors N31, N32, and N3k among the third NMOS transistors N31 to N3k may be turned on, and thus the redundant OTP cell transistors RC of the OTP memory cells OC111, OC112 (not shown), and OC11k may be programmed and the redundant OTP cell transistors RC of the remaining OTP memory cells may not be programmed.

As described above, the main OTP cell transistors MC and the redundant OTP cell transistors RC of the selected OTP memory cells may be sequentially programmed by sequentially performing the first program operation and the second program operation.

In this case, the read operation of the selected OTP memory cells may be performed as described above with reference to FIG. 7.

The OTP memory 100 or 200 according to the above-described example embodiments is configured to receive the k-bit input data DIN and generate the k-bit output data DOUT when the program operation (or the first program operation and the second program operation) and the read operation are performed. According to some example embodiments, however, the OTP memory may be configured to receive one or more pieces of the k-bit input data DIN and generate one or more pieces of bit output data DOUT, unlike that illustrated in the drawings.

In the OTP memory 100 or 200 according to the above-described example embodiments, the structure of the OTP memory cells of the OTP memory cell array 16 may be simplified and may have a reduced chip size. Furthermore, the main OTP cell transistors MC and the redundant OTP cell transistors RC of the OTP memory cell array 16 need not be controlled separately (e.g., may both be controlled by the same word line selection signal w1), and thus can be controlled with relative ease, and the structure of the row line driver 12 or 12' may be simplified to additionally reduce the chip size.

Figure 11:
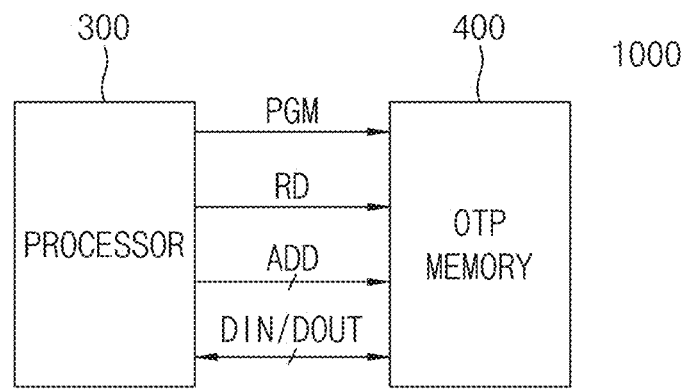
FIG. 11 is a block diagram of a memory system 1000 according to an example embodiment.

FIG. 11 is a block diagram of a memory system 1000 according to an example embodiment. The memory system 1000 may include a processor 300 and an OTP memory 400.

Functions of the blocks illustrated in FIG. 11 will be described below.

The processor 300 may transmit a program command PGM, a read command RD, an address signal ADD, and input data DIN and receive output data DOUT. The processor 300 may transmit the address signal ADD and the input data DIN, together with the program command PGM, transmit the address signal ADD together with the read command RD, and receive the output data DOUT.

The OTP memory 400 may receive the program command PGM, the read command RD, the address signal ADD, and the input data DIN and generate the output data DOUT. The OTP memory 400 may perform the program operation by receiving the address signal ADD and the input data DIN together with the program command PGM and may perform the read operation by receiving the address signal ADD together with the read command RD. The OTP memory 400 may be substantially the same as the OTP memory described above with reference to FIGS. 1 and 10.

The controller 14 or 14', the processor 300, and/or various circuitries disclosed herein may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

According to the example embodiments of the inventive concepts, an OTP memory cell can have a simple structure and be easy to control.

According to some example embodiments of the inventive concepts, a chip size of an OTP memory can be reduced due to a relatively simple structure of OTP memory cells of an OTP memory cell array. Furthermore, the chip size of the OTP memory can be additionally reduced because the memory cell array is relatively easy to control and thus a row driver has a relatively simple structure.

While some example embodiments of the inventive concepts have been described with reference to the accompanying drawings, it should be understood by those skilled in the art that various modifications may be made without departing from the scope of the inventive concepts and without changing essential features thereof. Therefore, the above-described example embodiments should be considered in a descriptive sense only and not for purposes of limitation.

What is claimed is:

1. A one-time programmable (OTP) memory cell comprising:
a main OTP cell transistor, a redundant OTP cell transistor, and an access transistor connected in series between a first node and a second node, the first node being in a floating state,
wherein a program voltage is applied to a first gate of the main OTP cell transistor and a second gate of the redundant OTP cell transistor, a program access voltage is applied to a third gate of the access transistor, the first node is kept in the floating state, and a program allowance voltage is applied to the second node, during a program operation, and wherein the program access voltage is lower than the program voltage, and the program allowance voltage is lower than the program access voltage.

2. The OTP memory cell of claim 1, wherein a read voltage is applied to the first gate of the main OTP cell transistor and the second gate of the redundant OTP cell transistor, a read access voltage is applied to the third gate of the access transistor, the first node is kept in the floating state, and a read allowance voltage is applied to the second node, during a read operation, and the read voltage is lower than the program voltage, the read access voltage is lower than the program access voltage, and the read allowance voltage is same as the program allowance voltage.

3. The OTP memory cell of claim 2, wherein:

the read voltage is lower than the program access voltage; and the read access voltage is lower than the read voltage.

4. The OTP memory cell of claim 1, wherein:

the program operation includes a first program operation and a second program operation;

program voltage is applied to the first gate of the main OTP cell transistor, the program access voltage is applied to the second gate of the redundant OTP cell transistor and the third gate of the access transistor, and the first node is kept in the floating state, and the program allowance voltage is applied to the second node, in the first program operation; and the first gate of the main OTP cell transistor is in the floating state, the program voltage is applied to the second gate of the redundant OTP cell transistor, the program access voltage is applied to the third gate of the access transistor, the first node is kept in the floating state, and the program allowance voltage is applied to the second node, in the second program operation that is subsequent to the first program operation.

5. The OTP memory cell of claim 4, wherein a read voltage is applied to the first gate of the main OTP cell transistor and the second gate of the redundant OTP cell transistor, a read access voltage is applied to the third gate of the access transistor, the first node is kept in the floating state, and a read allowance voltage is applied to the second node, during a read operation, and the read voltage is lower than the program voltage, the read access voltage is lower than the program access voltage, and the read allowance voltage is same as the program allowance voltage.

6. The OTP memory cell of claim 5, wherein:

the read voltage is lower than the program access voltage; and the read access voltage is lower than the read voltage.

7. A one-time programmable (OTP) memory comprising:

an OTP memory cell array including a plurality of OTP memory cells that are connected between a plurality of first row lines, a plurality of second row lines, a plurality of selection lines, and a plurality of bit lines;

a row decoder configured to decode a row address to generate a plurality of word line selection signals;

a row driver configured to drive the plurality of first row lines, the plurality of second row lines, and the plurality of selection lines in response to the plurality of word line selection signals;

a column decoder configured to decode a column address to generate a plurality of column selection signals; and an input/output (I/O) gating circuit configured to apply input data to bit lines selected from among the plurality of bit lines in response to the plurality of column selection signals in a program operation, wherein each of the OTP memory cells comprises a main OTP cell transistor, a redundant OTP cell transistor, and an access transistor that are connected in series between a first node in a floating state and a corresponding bit line from among the plurality of bit lines, the main OTP cell transistor comprises a first gate connected to a corresponding first row line from among the plurality of first row lines, the redundant OTP cell transistor comprises a second gate connected to a corresponding second row line from among the plurality of second row lines, and the access transistor comprises a third gate connected to a corresponding selection line from among the plurality of selection lines, and wherein the row driver is configured to, select a first row line, a second row line, and a selection line from among the plurality of first row lines, the plurality of second row lines, and the plurality of selection lines, respectively, in response to the plurality of word line selection signals, and apply a program voltage to the selected first row line and the selected second row line and a program access voltage to the selected selection line in the program operation, the program access voltage being lower than the program voltage during the program operation, wherein the I/O gating circuit is configured to apply a program allowance voltage in response to the input data to the selected bit lines, during the program operation, and wherein the first node is kept in the floating state during the program operation, and the program allowance voltage is lower than the program access voltage.

8. The OTP memory of claim 7, wherein the row driver is configured to apply a read voltage to the selected first and second row lines and a read access voltage to the selected selection line, during a read operation, the I/O gating circuit is configured to apply a read allowance voltage to the selected bit lines, during the read operation, the first node is kept in the floating state during the read operation, the read voltage is lower than the program voltage, and the read access voltage is lower than the program access voltage, and the read allowance voltage is same as the program allowance voltage.

9. The OTP memory of claim 8, wherein:

the read voltage is lower than the program access voltage; and the read access voltage is lower than the read voltage.

10. The OTP memory of claim 7, wherein:

the program operation includes a first program operation and a second program operation;

the row driver is configured to, apply the program voltage to the selected first row line and the program access voltage to the selected second row line and the selected selection line, in the first program operation, and keep the selected first row line be in the floating state, apply the program voltage to the selected second row line, and apply the program access voltage to the selected selection line, in the second program operation that is subsequent to the first program operation;

the I/O gating circuit is configured to apply a program allowance voltage om response to the input data to the selected bit lines, during the first program operation and the second program operation; and the first node is kept in the floating state during the first program operation and the second program operation.

11. The OTP memory of claim 10, wherein the row driver is configured to apply a read voltage to the selected first row line and the selected second row line and a read access voltage to the selected selection line, in a read operation, the I/O gating circuit is configured to apply a read allowance voltage to the selected bit line during the read operation, and the first node is kept in the floating state during the read operation, the read voltage is lower than the program voltage, the read access voltage is lower than the program access voltage, and the read allowance voltage is same as the program allowance voltage.

12. The OTP memory of claim 11, wherein:

the read voltage is lower than the program access voltage; and the read access voltage is lower than the read voltage.

13. The OTP memory of claim 10, wherein the I/O gating circuit configured to, apply the input data to the selected bit lines the first program operation or the second program operation, and transmit currents flowing through the selected bit lines in a read operation.

14. The OTP memory of claim 13, wherein the I/O gating circuit is configured to apply a program prohibition voltage to non-selected bit lines in response to the input data, in the program operation, the first program operation, or the second program operation, and the program prohibition voltage is higher than the program allowance voltage.

15. A memory system comprising:

a controller configured to transmit a program command or a read command, an address signal, and input data, and receive output data; and a one-time programmable (OTP) memory configured to receive one of the program command or the read command, the address signal, and the input data, and transmit the output data, the OTP memory including, an OTP memory cell array including a plurality of OTP memory cells that are connected between a plurality of first row lines, a plurality of second row lines, a plurality of selection lines, and a plurality of bit lines, a row decoder configured to decode a row address included in the address signal to generate a plurality of word line selection signals, and a row driver configured to drive the plurality of first row lines, the plurality of second row lines, and the plurality of selection lines in response to the plurality of word line selection signals, a column decoder configured to decode a column address to generate a plurality of column selection signals; and an input/output (I/O) gating circuit configured to apply input data to bit lines selected from among the plurality of bit lines in response to the plurality of column selection signals in a program operation, wherein each of the OTP memory cells comprises, a main OTP cell transistor, a redundant OTP cell transistor, and an access transistor that are connected in series between a first node in a floating state and a corresponding bit line from among the plurality of bit lines, the main OTP cell transistor comprises a first gate connected to a corresponding first row line from among the plurality of first row lines, the redundant OTP cell transistor comprises a second gate connected to a corresponding second row line from among the plurality of second row lines, and the access transistor comprises a third gate connected to a corresponding selection line from among the plurality of selection lines, and wherein the row driver is configured to, select a first row line, a second row line, and a selection line from among the plurality of first row lines, the plurality of second row lines, and the plurality of selection lines, respectively, in response to the plurality of word line selection signals, and apply a program voltage to the selected first row line and the selected second row line, and a program access voltage to the selected selection line in response to the program command, the program access voltage being lower than the program voltage, during the program operation, wherein the I/O gating circuit is configured to apply a program allowance voltage in response to the input data to the selected bit lines, during the program operation, and wherein the first node is kept in the floating state during the program operation, and the program allowance voltage is lower than the program access voltage.

16. The memory system of claim 15, wherein the row driver is configured to apply a read voltage to the selected first row line and the selected second row line and a read access voltage to the selected selection line, during a read operation, the I/O gating circuit is configured to apply to a read allowance voltage to the selected bit lines, during the read operation, and the first node is kept in the floating state during the read operation, the read voltage is lower than the program voltage, the read access voltage is lower than the program access voltage, and the read allowance voltage is same as the program allowance voltage.

17. The memory system of claim 16, wherein:

the read voltage is lower than the program access voltage; and the read access voltage is lower than the read voltage.

18. The memory system of claim 15, wherein:

the program operation includes a first program operation and a second program operation; and the row driver is configured to, apply the program voltage to the selected first row line and the program access voltage to the selected second row line and the selected selection line in the first program operation, and keep the selected first row line to be in the floating state, apply the program voltage to the selected second row line, and apply the program access voltage to the selected selection line in the second program operation that is subsequent to the first program operation, wherein the I/O gating circuit is configured to apply a program allowance voltage in response to the input data to the selected bit lines, during the first program operation and the second program operation, and wherein the first node is kept in the floating state during the first program operation and the second program operation.

19. The memory system of claim 18, wherein, the row driver is configured to apply a read voltage to the selected first row line and the selected second row line and a read access voltage to the selected selection line in a read operation, the I/O gating circuit is configured to apply a read allowance voltage to the selected bit line during the read operation, and the first node is kept in the floating state during the read operation, the read voltage is lower than the program voltage, the read access voltage is lower than the program access voltage, and the read allowance voltage is same as the program allowance voltage.

20. The memory system of claim 19, wherein:

the read voltage is lower than the program access voltage; and the read access voltage is lower than the read voltage.

* * * * *